United States Patent
Isogai et al.

(10) Patent No.: US 11,791,279 B2
(45) Date of Patent: Oct. 17, 2023

(54) SEMICONDUCTOR DEVICE WITH HYBRID CHANNEL

(71) Applicant: Kioxia Corporation, Tokyo (JP)

(72) Inventors: Tatsunori Isogai, Yokkaichi (JP); Masaki Noguchi, Yokkaichi (JP); Tatsufumi Hamada, Nagoya (JP); Shinichi Sotome, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 80 days.

(21) Appl. No.: 17/020,047

(22) Filed: Sep. 14, 2020

(65) Prior Publication Data

US 2021/0287998 A1  Sep. 16, 2021

(30) Foreign Application Priority Data

Mar. 10, 2020 (JP) .................. 2020-041271

(51) Int. Cl.
| | |
|---|---|
| *H01L 23/552* | (2006.01) |
| *H10B 43/27* | (2023.01) |
| *H10B 43/35* | (2023.01) |
| *H01L 21/324* | (2006.01) |

(52) U.S. Cl.
CPC .......... *H01L 23/552* (2013.01); *H01L 21/324* (2013.01); *H10B 43/27* (2023.02); *H10B 43/35* (2023.02)

(58) Field of Classification Search
CPC ...... H01L 27/115–11597; H10B 69/00; H10B 53/10; H10B 53/30; H10B 53/40; H10B 53/50; H10B 53/20; H10B 41/00; H10B 41/10; H10B 41/30; H10B 41/35; H10B 41/40; H10B 41/41; H10B 41/42; H10B 41/43; H10B 41/46; H10B 41/44; H10B 41/47; H10B 41/48; H10B 41/49; H10B 41/50; H10B 41/20; H10B 41/23; H10B 41/27; H10B 41/60; H10B 41/70; H10B 43/00; H10B 43/10; H10B 43/30; H10B 43/35; H10B 43/40; H10B 43/50; H10B 43/20; H10B 43/23; H10B 43/27;

(Continued)

(56) References Cited

U.S. PATENT DOCUMENTS

| | | | |
|---|---|---|---|
| 8,110,478 B2 | 2/2012 | Yamazaki et al. |
| 8,581,330 B2 | 11/2013 | Kiyotoshi |
| 8,854,855 B2 | 10/2014 | Jung et al. |

(Continued)

FOREIGN PATENT DOCUMENTS

| | | |
|---|---|---|
| JP | 2009-135451 A | 6/2009 |
| JP | 2013-038124 A | 2/2013 |
| WO | WO 2014/178203 A1 | 11/2014 |

*Primary Examiner* — Didarul A Mazumder
*Assistant Examiner* — Gustavo G Ramallo
(74) *Attorney, Agent, or Firm* — Oblon, McClelland, Maier & Neustadt, L.L.P.

(57) ABSTRACT

A semiconductor device according to an embodiment includes a stacked body having first films and second films that are alternately stacked, a light shielding film provided in a specific layer of the stacked body and having a higher optical absorptivity than that of the second films, and a channel film extending in the stacked body in the stacking direction. The channel film includes a first part located on an upper side than the light shielding film in the stacking direction and containing a monocrystalline semiconductor.

9 Claims, 22 Drawing Sheets

(58) Field of Classification Search
CPC ........ H10B 51/00; H10B 51/10; H10B 51/30; H10B 51/40; H10B 51/50; H10B 51/20
See application file for complete search history.

(56) References Cited

U.S. PATENT DOCUMENTS

| | | | |
|---|---|---|---|
| 9,397,111 B1 | 7/2016 | Chowdhury et al. | |
| 10,115,730 B1* | 10/2018 | Baraskar | H10B 43/27 |
| 2014/0001530 A1* | 1/2014 | Song | H01L 29/7926 |
| | | | 257/314 |
| 2016/0118396 A1* | 4/2016 | Rabkin | H01L 29/167 |
| | | | 257/314 |
| 2019/0198525 A1* | 6/2019 | Arreghini | H01L 27/1157 |
| 2020/0312724 A1* | 10/2020 | Moon | H01L 21/823487 |

* cited by examiner

SEMICONDUCTOR DEVICE WITH HYBRID CHANNEL

CROSS-REFERENCE TO RELATED APPLICATIONS

This application is based upon and claims the benefit of priority from Japanese Patent Application No. 2020-041271, filed on Mar. 10, 2020; the entire contents of which are incorporated herein by reference.

FIELD

The embodiments of the present invention relate to a semiconductor device and a manufacturing method thereof.

BACKGROUND

Semiconductor devices include a semiconductor storage device having a memory cell array with a three-dimensional structure. In such a semiconductor storage device, a channel film is formed in a stacked body where a plurality of conductive films are stacked.

DETAILED DESCRIPTION

Embodiments will now be explained with reference to the accompanying drawings. The present invention is not limited to the embodiments. In the following embodiments, a semiconductor device having a memory cell array with a three-dimensional structure is explained. The semiconductor device is a NAND non-volatile semiconductor storage device that can electrically and freely erase and write data and can retain stored contents even when power is turned off.

A semiconductor device according to an embodiment comprises a stacked body comprising first films and second films that are alternately stacked, a light shielding film provided in a specific layer of the stacked body and having a higher optical absorptivity than that of the second films, and a channel film extending in the stacked body in the stacking direction. The channel film comprises a first part located on an upper side than the light shielding film in the stacking direction and containing a monocrystalline semiconductor.

First Embodiment

Figure 1:
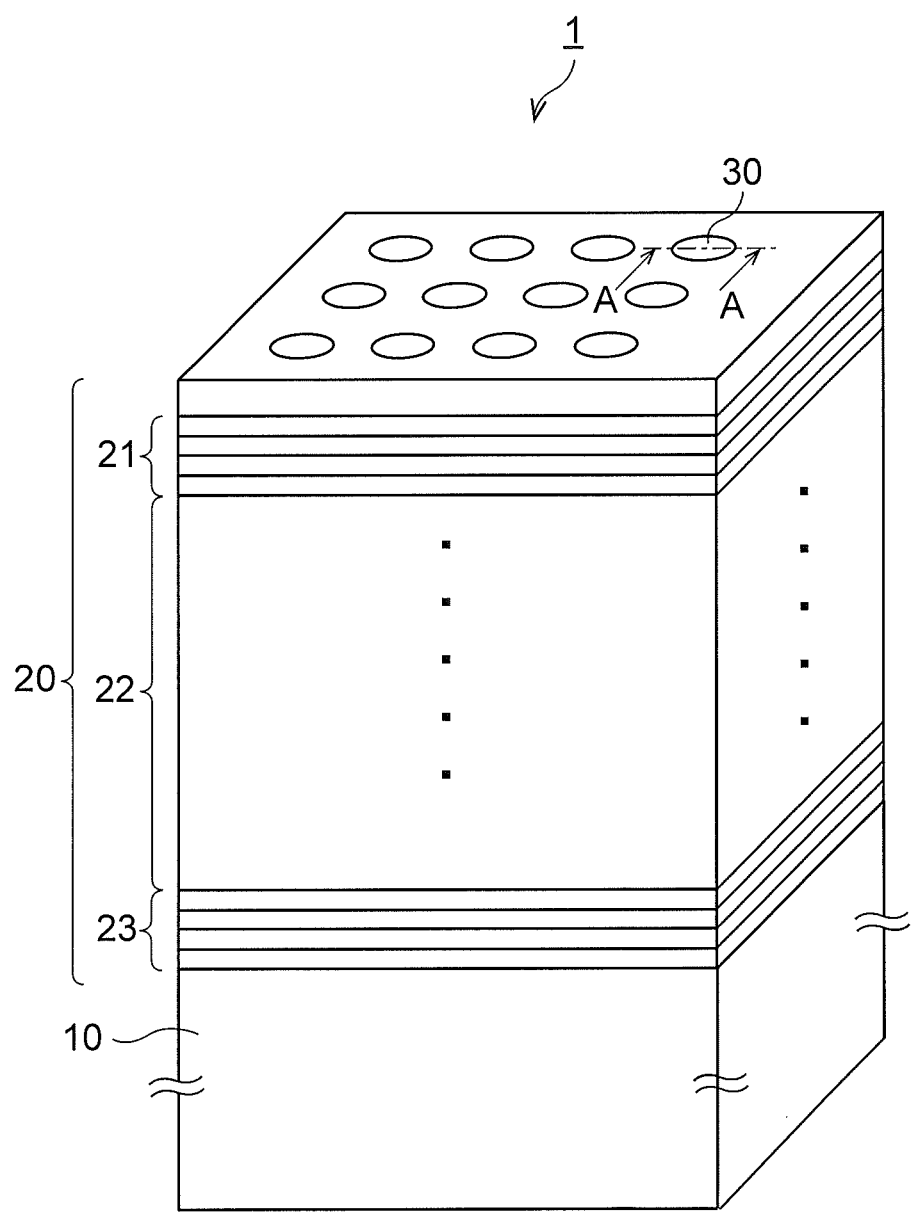
FIG. 1 is a perspective view illustrating a structure of relevant parts of a semiconductor device according to a first embodiment.

FIG. 1 is a perspective view illustrating a structure of relevant parts of a semiconductor device according to a first embodiment. A semiconductor device 1 illustrated in FIG. 1 includes a substrate 10, a stacked body 20, and a plurality of semiconductor films 30. In the following explanations, two directions parallel to the substrate 10 and orthogonal to each other are assumed as an X-direction and a Y-direction. A direction perpendicular to the substrate 10 and orthogonal to the X-direction and the Y-direction is assumed as a Z-direction. The Z-direction is also a stacking direction of the stacked body 20.

The substrate 10 is, for example, a silicon substrate. The stacked body 20 is provided on the substrate 10. A layer having drive elements such as transistors used to drive the semiconductor films 30 or a layer in which lines used to drive the semiconductor films 30 are formed may be formed between the substrate 10 and the stacked body 20.

The stacked body 20 includes an SGD 21, a cell 22, and an SGS 23. The SGD 21 is located in the topmost layer of the stacked body 20 and includes a plurality of drain-side selection gate electrodes. The SGS 23 is located in the bottommost layer of the stacked body 20 and includes a plurality of source-side selection gate electrodes. The cell 22 is located between the SGD 21 and the SGS 23 and includes a plurality of word lines.

The semiconductor films 30 are arranged in a staggered manner in the X-direction and the Y-direction. The semiconductor films 30 extend in the stacked body 20 in the Z-direction.

Figure 2:
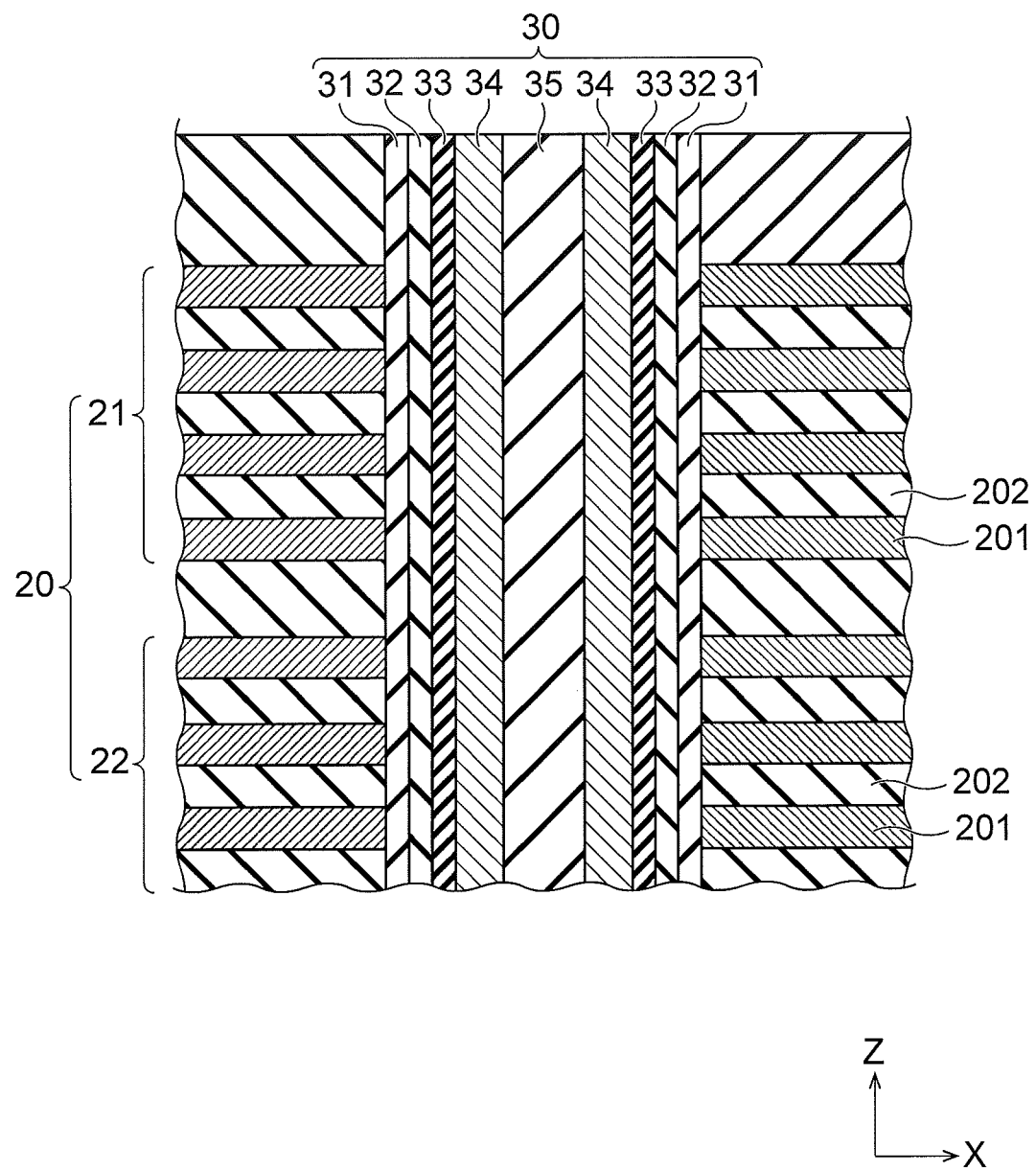
FIG. 2 is a diagram illustrating a part of a cross-section along a section line A-A illustrated in FIG. 1.

FIG. 2 is a diagram illustrating a part of a cross-section along a section line A-A illustrated in FIG. 1. Structures of the stacked body 20 and the semiconductor films 30 are explained below with reference to FIG. 2.

The structure of the stacked body 20 is explained first. As illustrated in FIG. 2, a plurality of conductive films 201 and a plurality of insulating films 202 in plate shapes are alternately stacked in the Z-direction in the stacked body 20. The conductive films 201 are an example of first films and contain a metal such as tungsten (W). The insulating films 202 are an example of second films and contain silicon dioxide ($SiO_2$).

Among the conductive films 201, conductive films 201 formed in the SGD 21 are the drain-side selection gate electrodes described above. Conductive films 201 formed in the cell 22 are the word lines described above. Although not illustrated in FIG. 2, conductive films 201 formed in the SGS 23 are the source-side selection gate electrodes described above.

The structure of the semiconductor films 30 is explained next. In the semiconductor film 30 illustrated in FIG. 2, a block dielectric film 31, a charge accumulation film 32, a tunnel dielectric film 33, a channel film 34, and a core dielectric film 35 are stacked in this order. The block dielectric film 31, the charge accumulation film 32, and the tunnel dielectric film 33 are examples of a memory film.

The block dielectric film 31, the tunnel dielectric film 33, and the core dielectric film 35 contain, for example, silicon dioxide. The charge accumulation film 32 contains, for example, silicon nitride (SiN). A high-dielectric constant insulating film (High-k) material may be used as the material for the block dielectric film 31, the charge accumulation film 32, and the tunnel dielectric film 33. The High-k material is, for example, hafnium oxide ($HfO_2$), aluminum oxide ($Al_2O_3$), titanium oxide ($TiO_2$), barium oxide (BaO), ruthenium oxide ($RuO_4$), lanthanum oxide ($La_2O_3$), zirconium oxide ($ZrO_2$), yttrium oxide ($Y_2O_3$), magnesium oxide (MgO), tantalum oxide ($Ta_2O_5$), strontium oxide (SrO), or niobium oxide ($Nb_2O_5$). The High-k material described above may be an oxynitride such as aluminum oxynitride (AlON), hafnium oxynitride (HfON), titanium oxynitride (TiON), or zirconium oxynitride (ZrON). The High-k material described above may alternatively be a composite of metallic oxides having different valences, which are obtained by adding aluminum, iodine, or lanthanum to a metallic oxide such as titanium oxide, hafnium oxide, or zirconium oxide, or by adding titanium, hafnium, zirconia to a metallic oxide such as tantalum oxide or niobium oxide.

The channel film 34 contains monocrystalline silicon. The monocrystalline silicon is an example of a monocrystalline semiconductor. Although not illustrated in FIG. 2, the channel film of the SGS 23 may be formed by epitaxially growing silicon contained in the substrate 10.

In the semiconductor device 1 according to the present embodiment, intersections between the semiconductor films 30 and the conductive films 201 serve as vertical transistors. Among the vertical transistors, intersections between the conductive films 201 (the drain-side selection gate electrodes) of the SGD 21 and the semiconductor films 30 are drain-side selection transistors. Intersections between the conductive films 201 (the source-side selection gate electrodes) of the SGS 23 and the semiconductor films 30 are source-side selection transistors. Intersections between the conductive films 201 (the word lines) of the cell 22 and the semiconductor films 30 are memory cells. The drain-side selection transistors, the memory cells, and the source-side selection transistors are connected in series.

A manufacturing process of the semiconductor device according to the present embodiment is explained below with reference to FIGS. 3 to 6.

Figure 3:
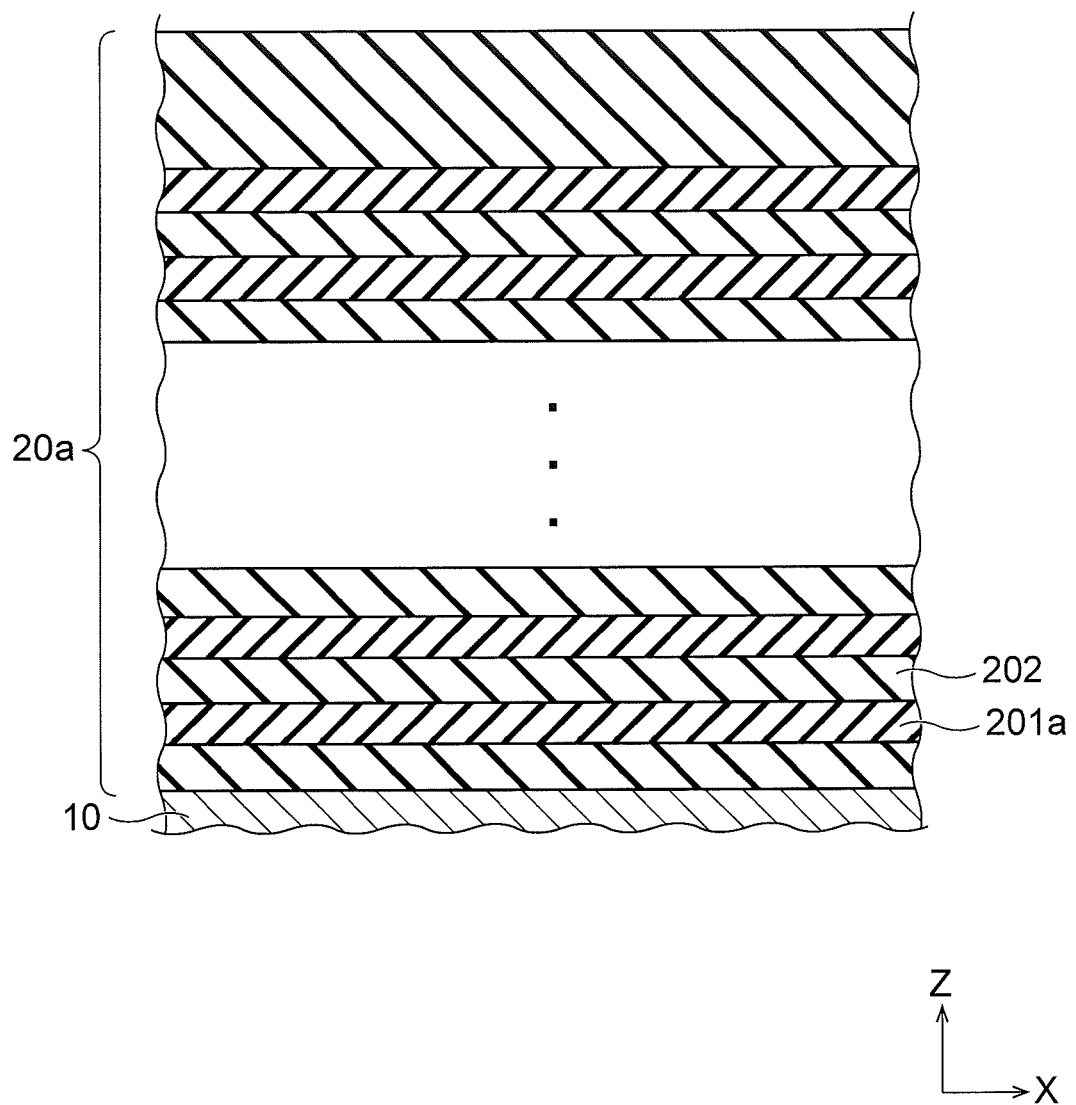
FIG. 3 is a sectional view illustrating a process of forming a stacked body according to the first embodiment.

First, a stacked body 20a is formed on the substrate 10 as illustrated in FIG. 3. In the stacked body 20a, a plurality of insulating films 201a and the insulating films 202 in plate shapes are alternately stacked in the Z-direction. The insulating films 201a are another example of the first films and contain, for example, silicon nitride. The stacked body 20a can be formed, for example, by CVD (Chemical Vapor Deposition) or ALD (Atomic Layer Deposition).

Figure 4:
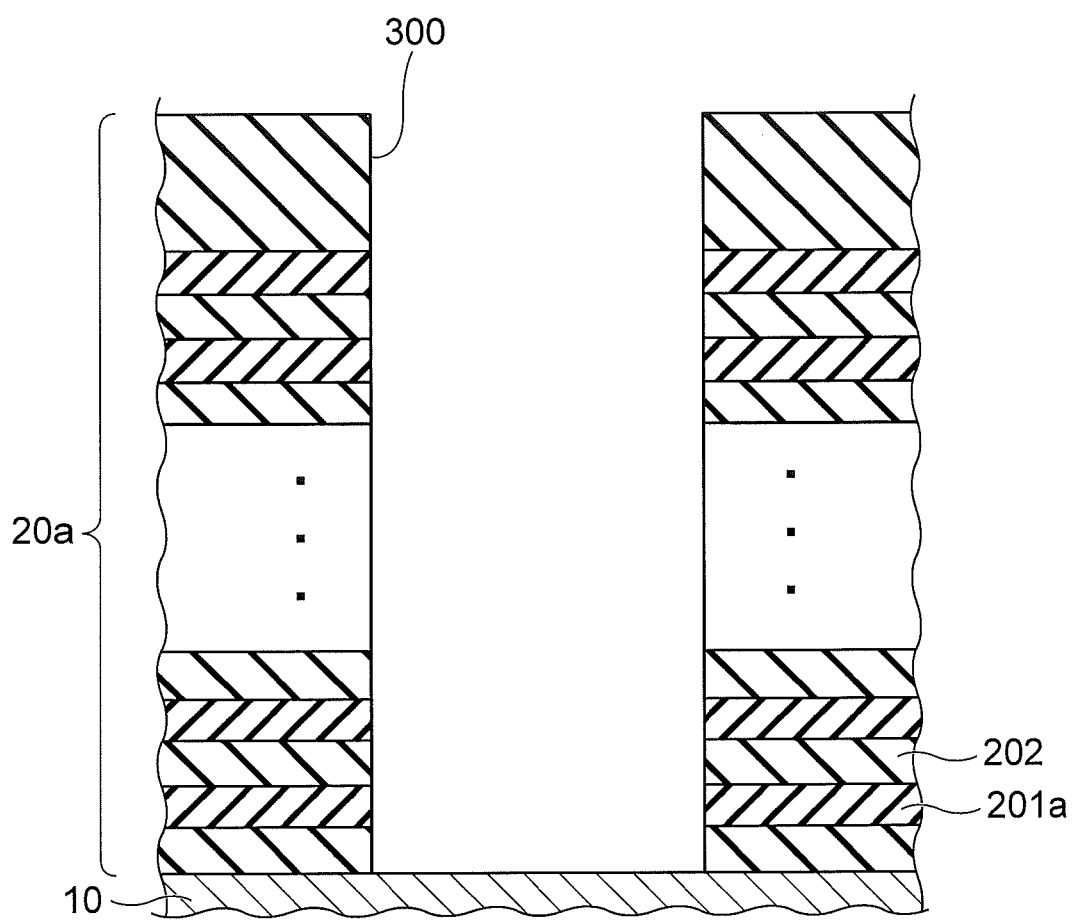
FIG. 4 is a sectional view illustrating a process of forming holes according to the first embodiment.

Next, holes 300 penetrating the stacked body 20a in the Z-direction are formed as illustrated in FIG. 4. The holes 300 are formed at arrangement places of the semiconductor films 30 described above. The holes 300 can be formed, for example, by RIE (Reactive Ion Etching).

Figure 5:
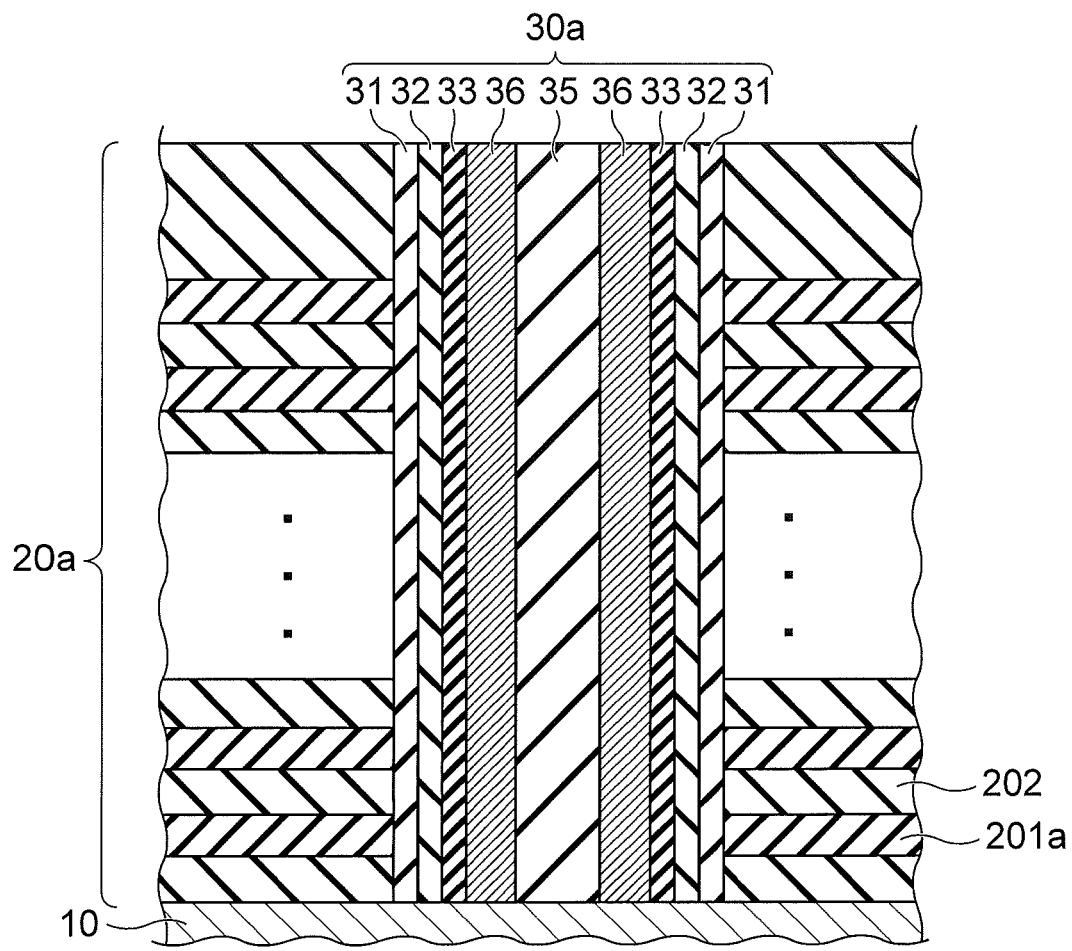
FIG. 5 is a sectional view illustrating a process of forming a semiconductor film according to the first embodiment.

Next, a semiconductor film 30a is formed in each of the holes 300 as illustrated in FIG. 5. Specifically, the block dielectric film 31, the charge accumulation film 32, and the tunnel dielectric film 33 are first formed successively in this order.

Next, an amorphous silicon film is formed thereon, for example, in a temperature condition at about 500° C. Subsequently, the amorphous silicon film is subjected to heat treatment at 700° C. or a higher temperature. Accordingly, a macaroni-shaped channel film 36 made of polycrystalline silicon is formed on the tunnel dielectric film 33. The channel film 36 may be in the state of amorphous silicon without being subjected to the heat treatment described above. After formation of the channel film 36, the core dielectric film 35 is embedded therein for the purpose of closing opening portions of the holes 300.

Figure 6:
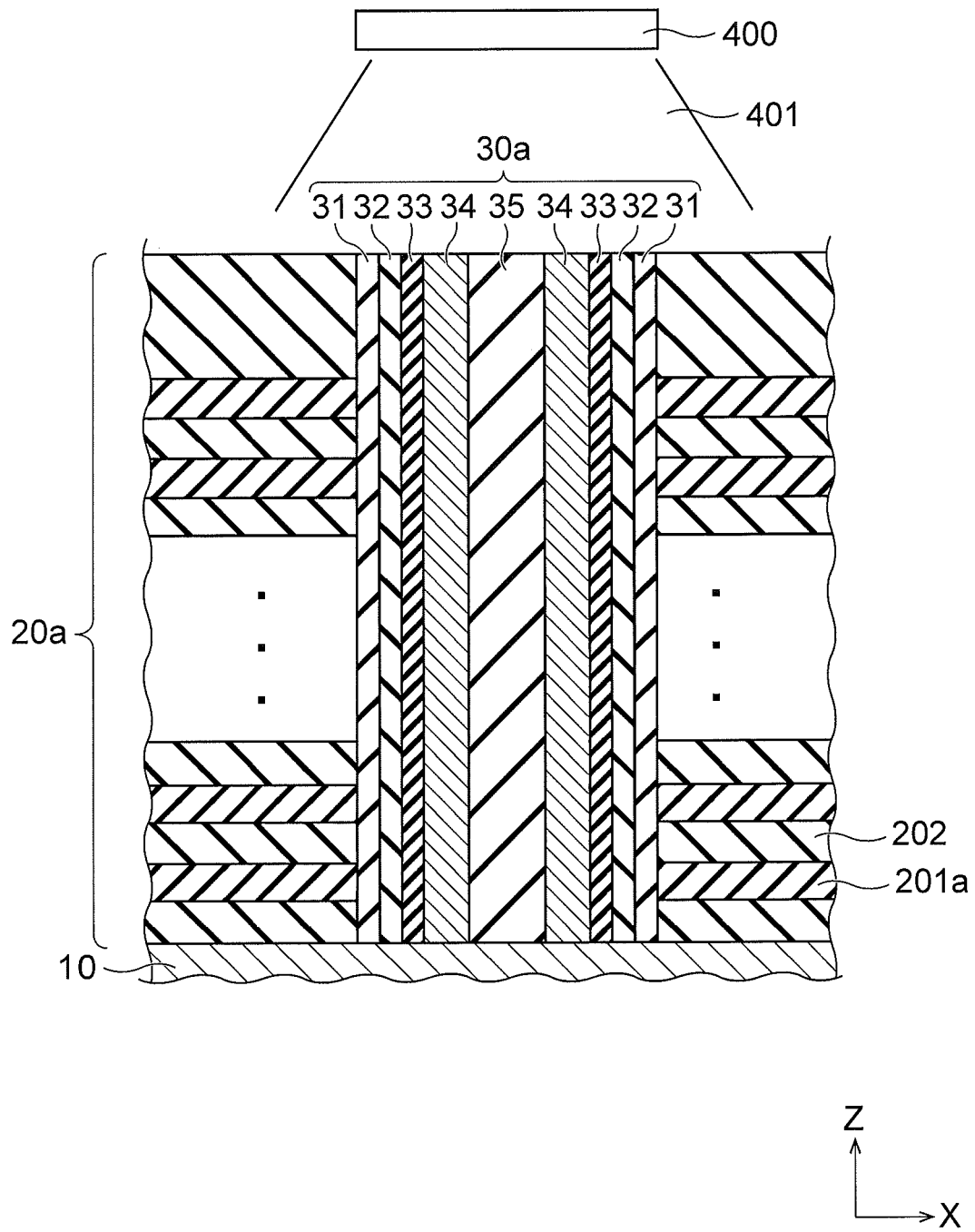
FIG. 6 is a sectional view illustrating a process of flashlamp annealing according to the first embodiment.

Next, flashlamp annealing is performed as illustrated in FIG. 6. In the flashlamp annealing, a light source 400 emits flashlamp light 401 from above the stacked body 20a. The light source 400 is, for example, a xenon flashlamp. When a voltage at about 3000 volts is applied to the light source 400, the flashlamp light 401 is emitted toward the stacked body 20a. In order to enhance the absorption efficiency of the flashlamp light 401, for example, preliminary heating at 600° C. or a higher temperature may be performed before emission of the flashlamp light 401.

The flashlamp light 401 includes light of various wavelengths, for example, about 300 nanometers to 1000 nanometers. In the flashlamp light 401, light of about 400 nanometers to 500 nanometers has a highest absorption efficiency to silicon and light equal to or longer than 500 nanometers has a lower absorption efficiency to silicon as the wavelength is longer. That is, light of short wavelengths is absorbed by silicon upper layers and light of long wavelengths reaches silicon lower layers.

As described above, the flashlamp light 401 is absorbed into silicon contained in the stacked body 20a. At this time, the channel films 36 of the semiconductor films 30a have a higher absorptivity for the flashlamp light 401 than those of other films because the channel films 36 are formed of polycrystalline silicon alone. Accordingly, the channel films 36 rapidly produce heat due to the absorbed flashlamp light 401 and melt. Further, the semiconductor films 30a are simultaneously irradiated with the flashlamp light 401 as illustrated in FIG. 1. Therefore, the channel films 36 are more likely to melt because the channel films 36 in adjacent semiconductor films 30a mutually produce heat. When irradiation with the flashlamp light 401 thereafter ends, the channel films 36 are cooled and solidify. As a result, the channel films 36 formed of polycrystalline silicon are processed into the channel films 34 formed of monocrystalline silicon.

It is desirable that the flashlamp annealing described above is performed after the core dielectric film 35 is partially or entirely embedded. If the channel film 36 is melted in a state where the core dielectric film 35 is not embedded at all, there is a risk of a meltdown phenomenon where the channel film 36 melts and deposits on lower portions of the holes 300. While the flashlamp annealing is performed in a nitrogen atmosphere in the present embodiment, the flashlamp annealing may be performed in any atmosphere.

After the channel film 36 is monocrystallized by the flashlamp annealing, the insulating films 201a are etched, for example, with a phosphoric acid solution and thereafter the conductive films 201 are formed, for example, using CVD at places where the insulating films 201a have been etched. As a result, the stacked body 20 illustrated in FIG. 2 is completed. The flashlamp annealing described above may be performed at any timing after at least a part of the core dielectric film 35 is deposited on the channel film 36. Therefore, the flashlamp annealing may be performed after completion of the stacked body 20.

According to the present embodiment described above, the channel film is monocrystallized by flashlamp annealing. That is, the grain size of the semiconductor material of the channel film is increased. Accordingly, scattering of carriers in the channel film is less likely to occur and thus the mobility of the carriers can be improved. As a result, switching operations of the drain-side selection transistors located in an upper portion of the stacked body 20 can be improved or write operations and erase operations of the memory cells can be improved.

Second Embodiment

Figure 7:
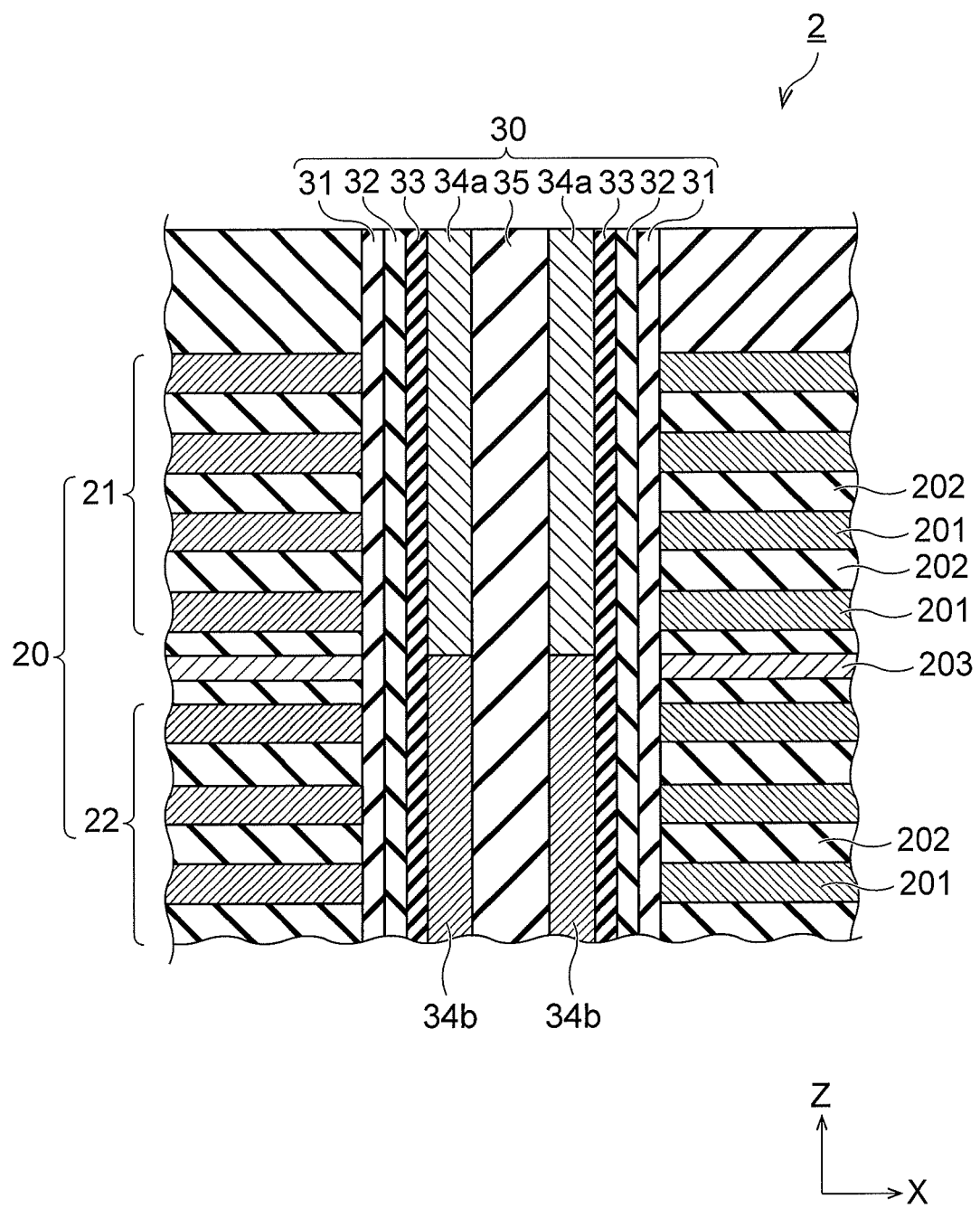
FIG. 7 is a sectional view illustrating a structure of relevant parts of a semiconductor device according to a second embodiment.

FIG. 7 is a sectional view illustrating a structure of relevant parts of a semiconductor device according to a second embodiment. Constituent elements identical to those of the first embodiment described above are denoted by like reference signs and detailed explanations thereof are omitted.

In a semiconductor device 2 illustrated in FIG. 7, a light shielding film 203 is stacked between the SGD 21 and the cell 22. The light shielding film 203 has a higher absorptivity for the flashlamp light 401 than that of the insulating films 202. In a case in which the light shielding film 203 is a conductive material, it is desirable that the light shielding film 203 is sandwiched by two insulating films 202 as illustrated in FIG. 7 to ensure insulation between conductive films 201. In other words, it is desirable that the insulating films 202 are formed between the light shielding film 203 and the conductive films 201.

In the semiconductor device 2 according to the present embodiment, the channel film 34 is divided into a monocrystalline semiconductor part 34a and a polycrystalline semiconductor part 34b by the light shielding film 203 on the boundary as illustrated in FIG. 7. The monocrystalline semiconductor part 34a is an example of a first part and is located on an upper side than the light shielding film 203. Meanwhile, the polycrystalline semiconductor part 34b is connected to a lower end portion of the monocrystalline semiconductor part 34a. The monocrystalline semiconductor part 34a functions as channels of the drain-side selection transistors. The polycrystalline semiconductor part 34b functions as channels of the memory cells.

A manufacturing process of the semiconductor device according to the present embodiment is explained below with reference to FIGS. 8 to 11.

Figure 8:
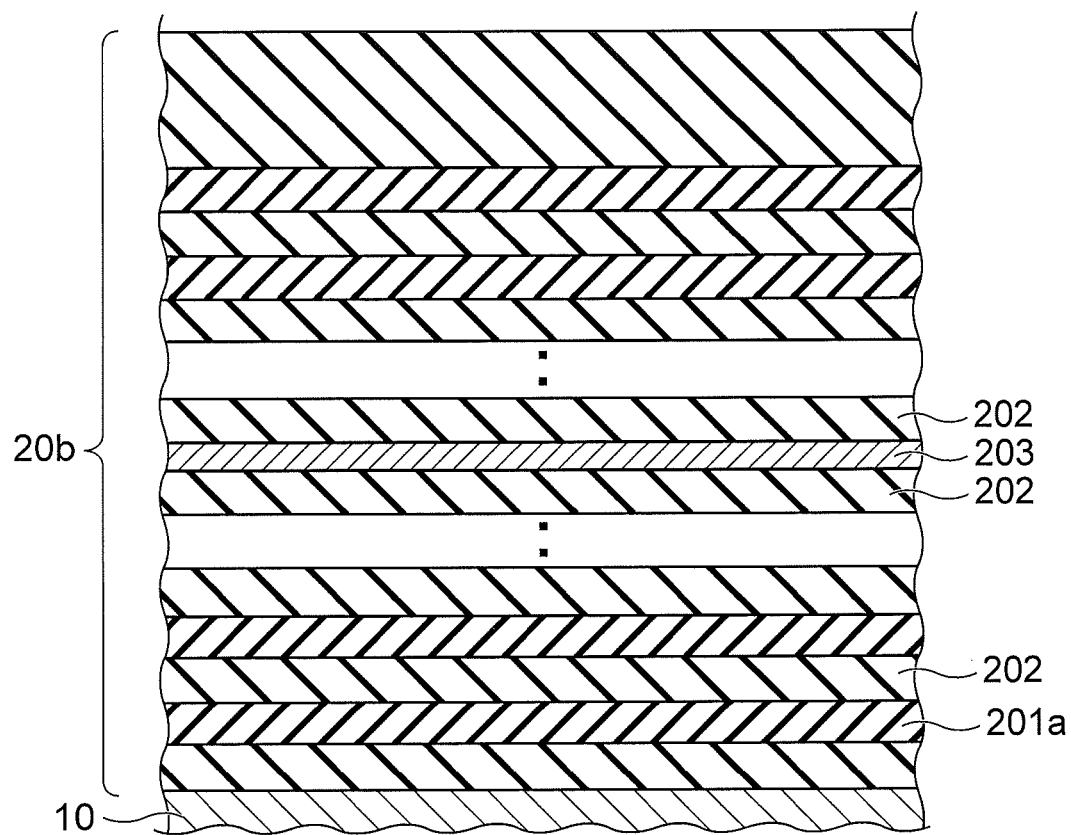
FIG. 8 is a sectional view illustrating a process of forming a stacked body according to the second embodiment.

First, a stacked body 20b is formed on the substrate 10 as illustrated in FIG. 8. In the stacked body 20b, the insulating films 201a and the insulating films 202 in plate shapes are alternately stacked in the Z-direction similarly in the first embodiment. Additionally, the light shielding film 203 is formed in a specific layer of the stacked body 20b, specifically, a boundary layer between the SGD 21 and the cell 22.

The light shielding film 203 can be formed, for example, using CVD or ALD. The material of the light shielding film 203 contains, for example, silicon. It suffices that the light shielding film 203 is a material that can block light to some extent and a high melting point metal such as tungsten or molybdenum may be used. The film thickness of the light shielding film 203 is, for example, 15 nanometers to 20 nanometers.

Figure 9:
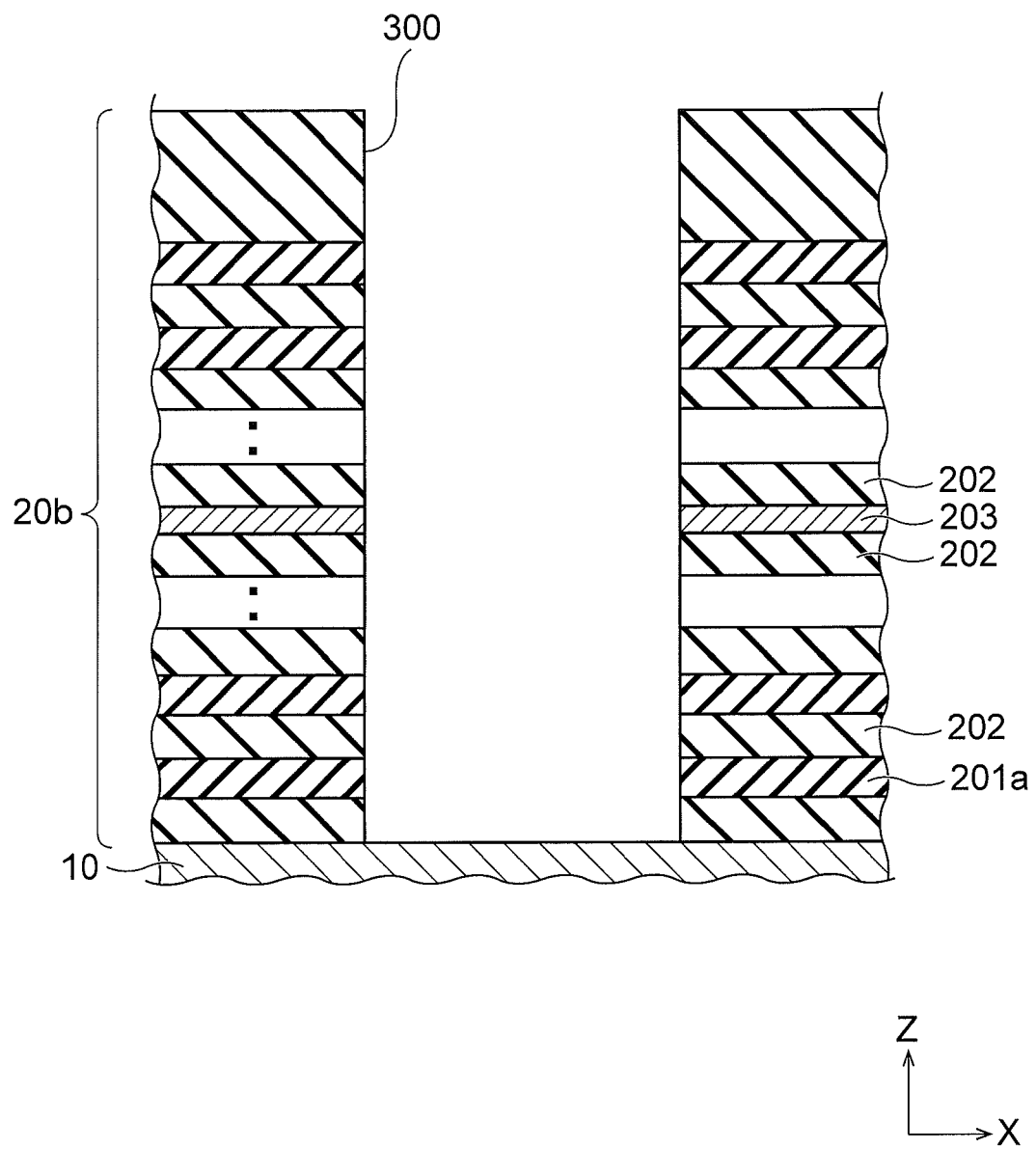
FIG. 9 is a sectional view illustrating a process of forming holes according to the second embodiment.

Next, the holes 300 penetrating the stacked body 20b in the Z-direction are formed as illustrated in FIG. 9. The holes 300 can be formed using RIE as explained in the first embodiment. In the present embodiment, the material of the light shielding film 203 is not a metal or a metallic oxide but silicon. Therefore, the light shielding film 203 can be processed in a lump along with the insulating films 201a and the insulating films 202 at the time of forming the holes 300.

Figure 10:
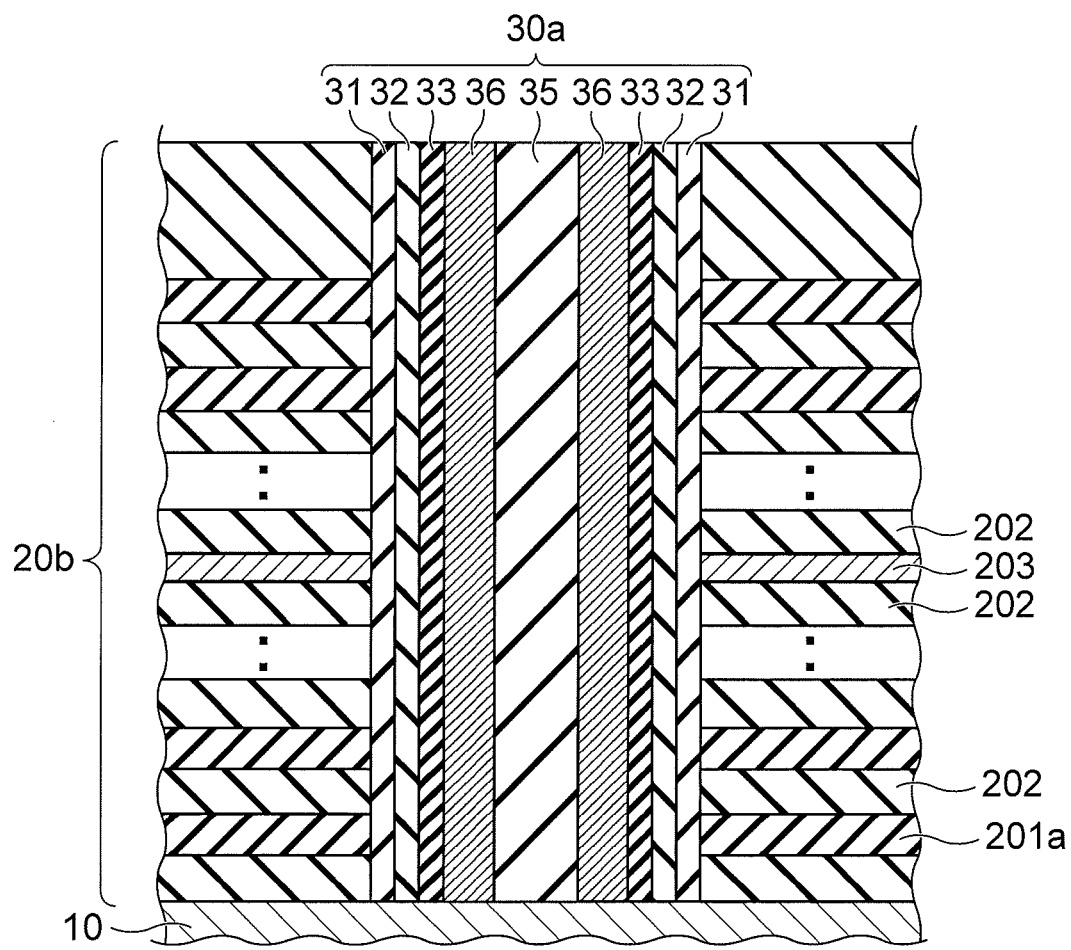
FIG. 10 is a sectional view illustrating a process of forming a semiconductor film according to the second embodiment.

Subsequently, the semiconductor film 30a is formed in the holes 300 as illustrated in FIG. 10. The semiconductor film 30a is formed by an identical method to that in the first embodiment. That is, the block dielectric film 31, the charge accumulation film 32, the tunnel dielectric film 33, the channel film 36, and the core dielectric film 35 are formed in this order.

Figure 11:
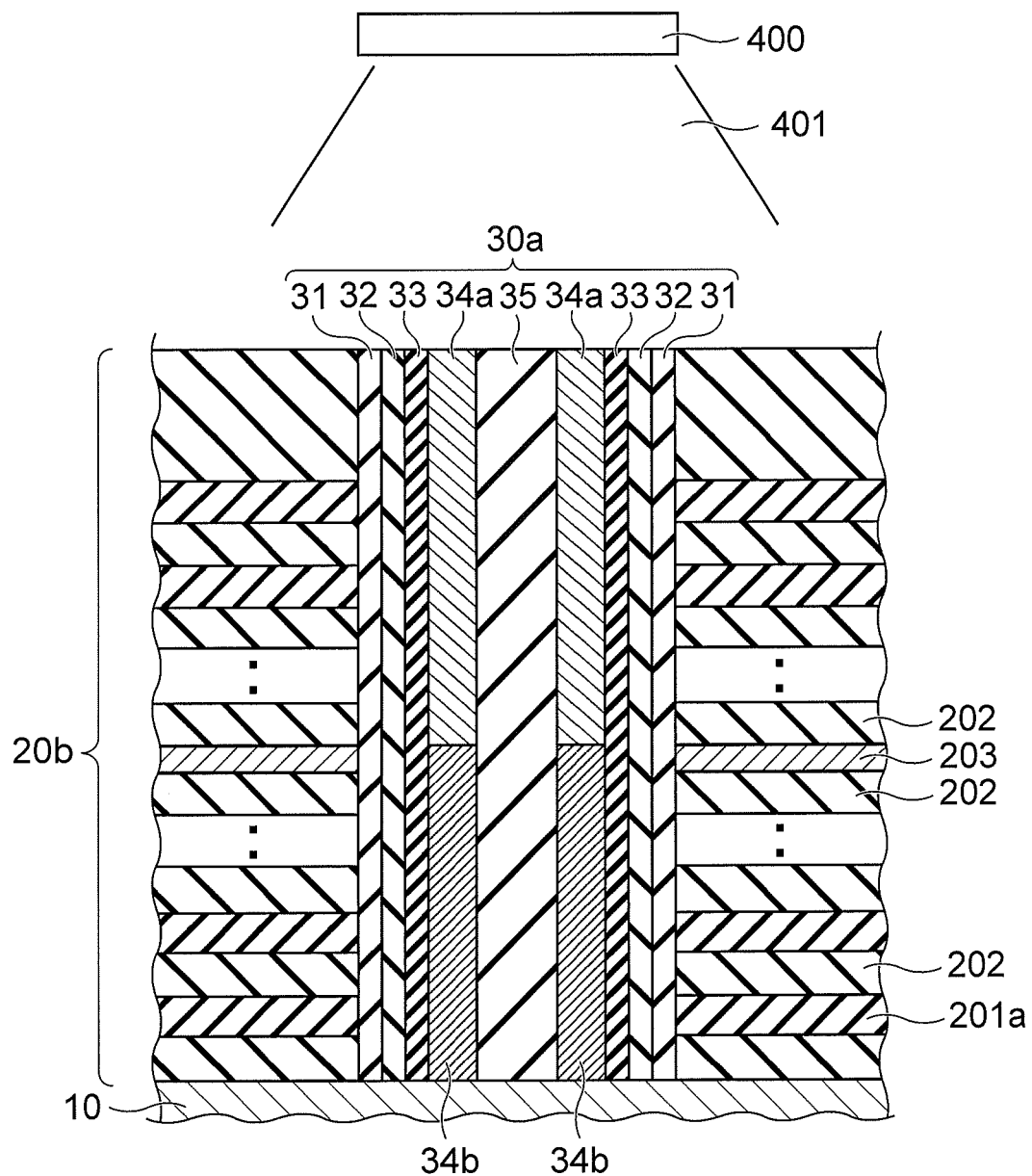
FIG. 11 is a sectional view illustrating a process of flashlamp annealing according to the second embodiment.

Next, flashlamp annealing is performed as illustrated in FIG. 11. In the flashlamp annealing, the light source 400 emits the flashlamp light 401 from above the stacked body 20b similarly in the first embodiment. In the present embodiment, the light source 400 is a xenon flashlamp.

The flashlamp light 401 is absorbed into silicon contained in an upper portion than the light shielding film 203 in the stacked body 20b. As a result, an upper portion of the channel film 36 than the light shielding film 203 produces heat and melts. Meanwhile, a lower portion than the light shielding film 203 is shielded by the light shielding film 203 and therefore can be prevented from melting. Accordingly, the channel film 36 is processed into the monocrystalline semiconductor part 34a located on the upper portion and the polycrystalline semiconductor part 34b located on the lower portion with the boundary as the light shielding film 203. The light shielding film 203 is formed, for example, in an amorphous state and becomes polysilicon due to irradiation with the flashlamp light 401.

The light shielding film 203 does not always become an exact boundary in view of heat diffusion and the like. For example, deviation in the crystallinity may occur up to three layers of insulating films 201a (conductive films 201) located on the lower side than the light shielding film 203.

In order to enhance the light shielding effect, it is desirable that the film thickness of the light shielding film 203 is larger. However, if the film thickness of the light shielding film 203 is too large, the distance between the SGD 21 and the cell 22 is increased and the channel resistance adversely becomes large.

For example, in a case in which the material of the light shielding film 203 is silicon and the wavelength of the flashlamp light 401 includes 458 nanometers, the transmission depth of light at 1414° C. that is the melting point of silicon is about 13 nanometers. Therefore, when the film thickness of the light shielding film 203 is, for example, in a range from 15 nanometers to 20 nanometers, the most part of the flashlamp light 401 is absorbed into the light shielding film 203 and entry of the flashlamp light 401 to a portion on the lower side than the light shielding film 203 can be suppressed.

After the upper portion of the channel film 36 is monocrystallized by the flashlamp annealing as described above, the insulating films 201a are replaced with the conductive films 201 similarly in the first embodiment. As a result, the stacked body 20 illustrated in FIG. 7 is completed. In a case in which the conductive films 201 are, for example, metallic films having a lower transmittance of the flashlamp light 401, absorption of the flashlamp light 401 is interfered if the conductive films 201 are formed before the upper portion of the channel film 36 is monocrystallized. Therefore, in the present embodiment, it is desirable that the flashlamp annealing is performed before the insulating films 201a are replaced with the conductive films 201.

According to the present embodiment described above, a portion to be monocrystallized in the channel film can be controlled by forming the light shielding film 203 in a desired specific layer of the stacked body. Because this reduces variation of the portion to be monocrystallized, monocrystallization of, for example, only a channel film of the drain-side selection transistors provided in the SGD 21 can be realized. Therefore, the resistance of the channel film of the drain-side selection transistors and contacts connected to the channel film can be reduced.

Third Embodiment

Figure 12:
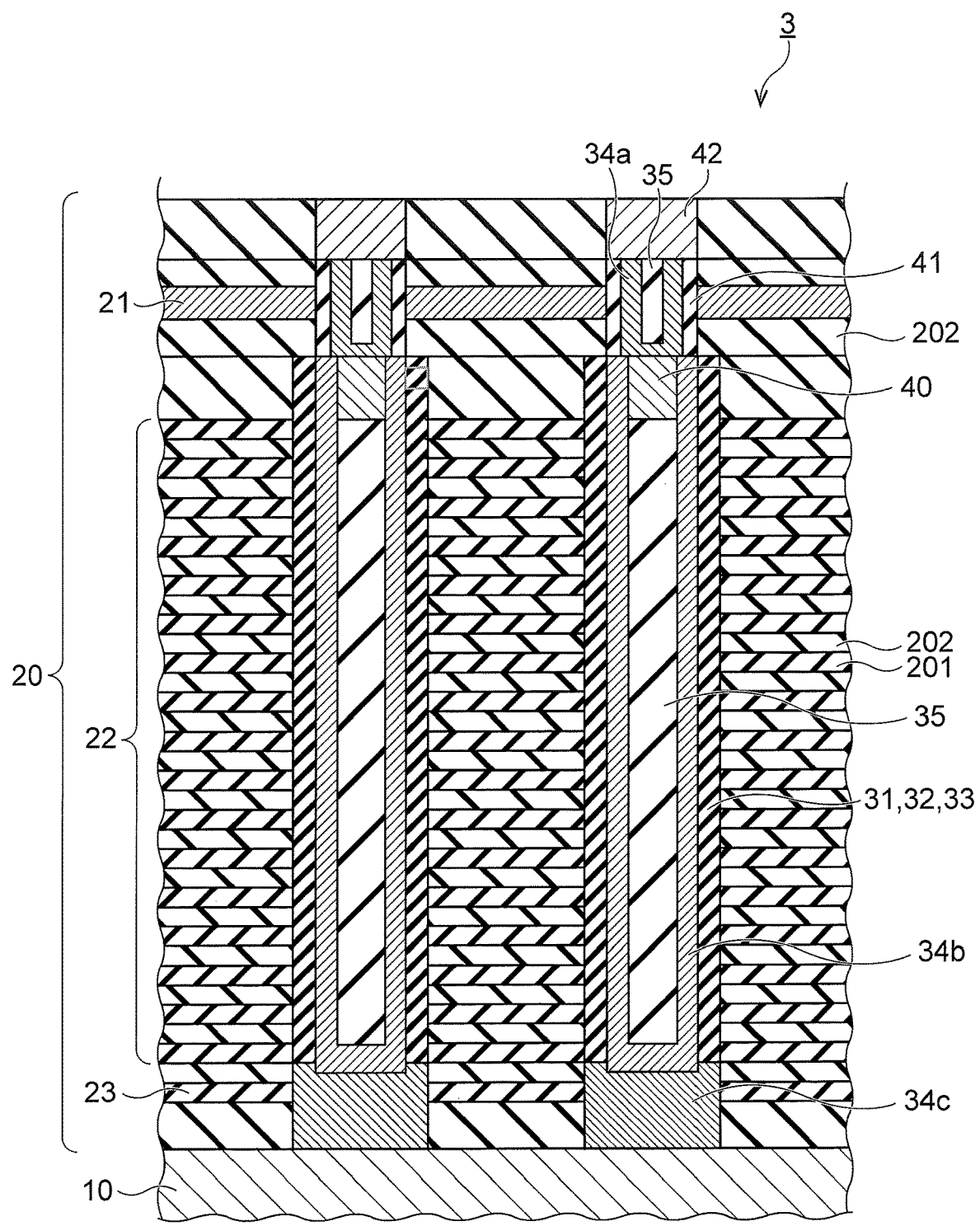
FIG. 12 is a sectional view illustrating a structure of relevant parts of a semiconductor device according to a third embodiment.

FIG. 12 is a sectional view illustrating a structure of relevant parts of a semiconductor device according to a third embodiment. Constituent elements identical to those of the first and second embodiments described above are denoted by like reference signs and detailed explanations thereof are omitted.

In a semiconductor device 3 illustrated in FIG. 12, the SGD 21 and the cell 22 are formed in different processes. Therefore, a core semiconductor film 40 is formed between the SGD 21 and a conductive film 21 (word line) in the cell 22. A gate dielectric film 41 is formed between the SGD 21 and each of the monocrystalline semiconductor parts 34a functioning as channel films of drain-side selection transistors. The SGD 21 and the conductive film 21 contain, for example, tungsten. The core semiconductor film 40 contains monocrystalline silicon or polysilicon.

A manufacturing process of the semiconductor device according to the present embodiment is explained below with reference to FIGS. 13 to 22.

Figure 13:
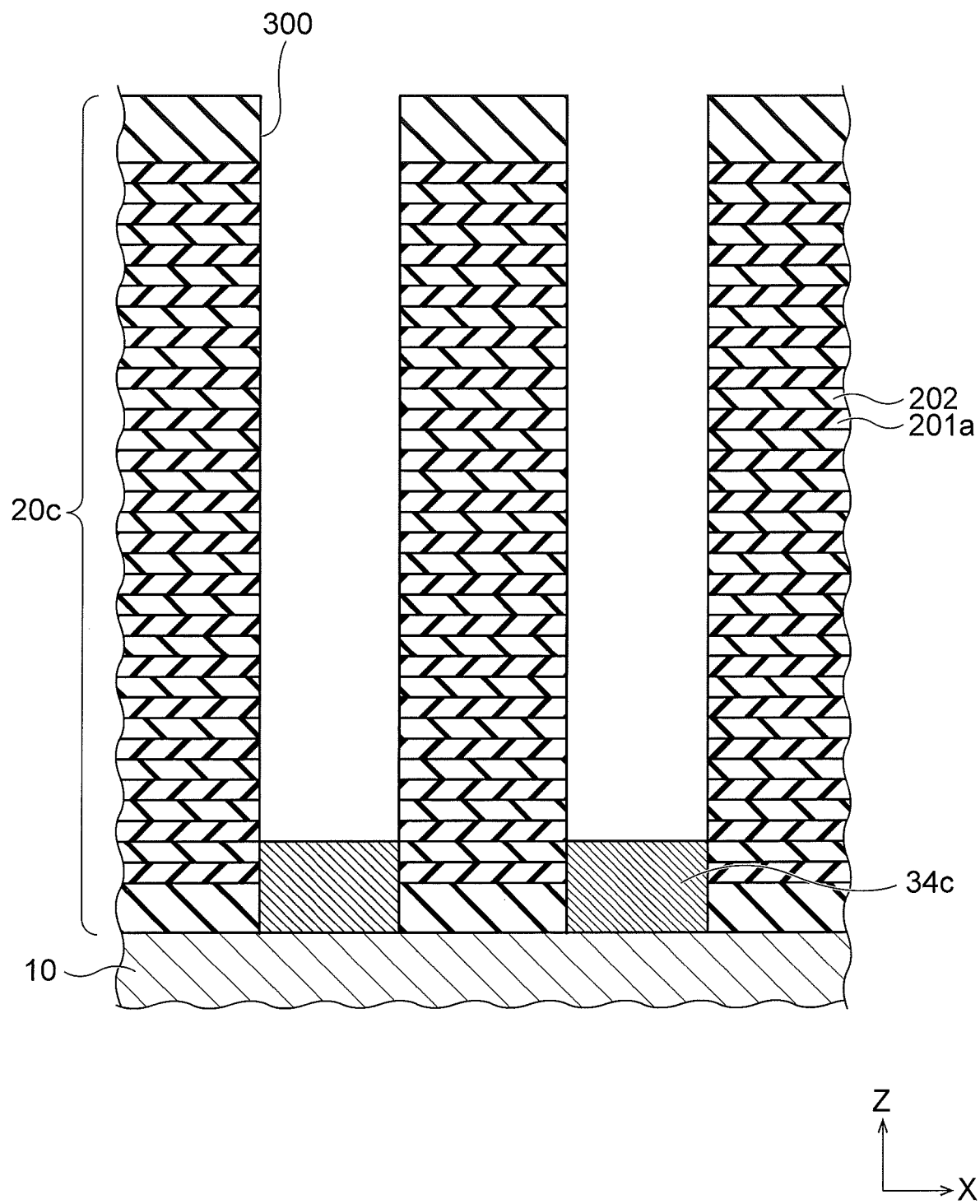
FIG. 13 is a sectional view illustrating a process of forming a monocrystalline semiconductor part according to the third embodiment.

First, as illustrated in FIG. 13, the holes 300 (first holes) penetrating a stacked body 20c are formed and silicon contained in the substrate 10 is thereafter epitaxially grown. Accordingly, monocrystalline semiconductor parts 34c functioning as channel films of source-side selection transistors are formed at bottom portions of the holes 300, respectively. The stacked body 20c is formed by alternately stacking the insulating films 201a and the insulating films 202 in plate shapes in the Z-direction similarly to the stacked body 20a explained in the first embodiment.

Figure 14:
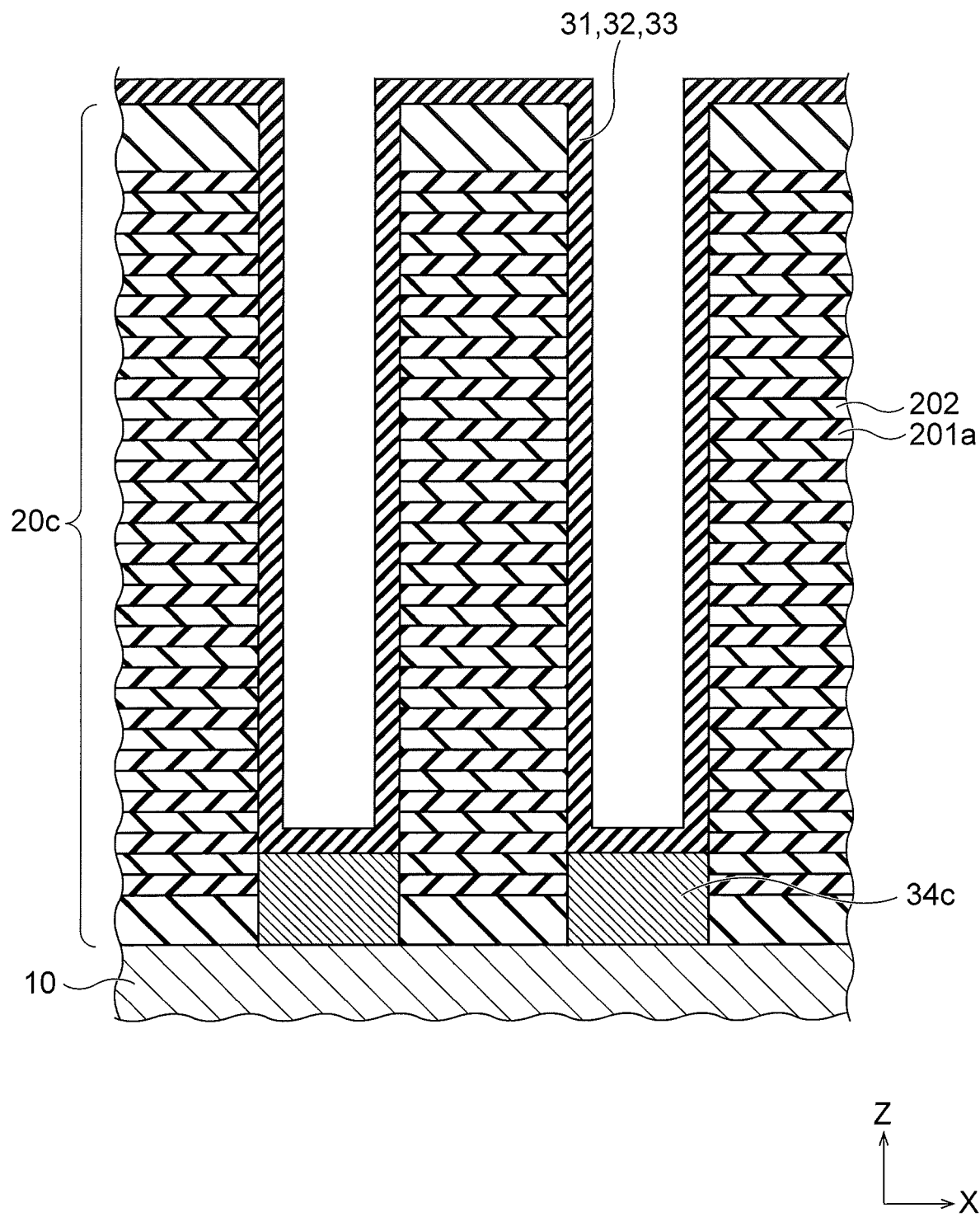
FIG. 14 is a sectional view illustrating a process of forming a memory film according to the third embodiment.

Next, a memory film is formed in the holes 300 as illustrated in FIG. 14. That is, the block dielectric film 31, the charge accumulation film 32, and the tunnel dielectric film 33 are formed successively in this order.

Figure 15:
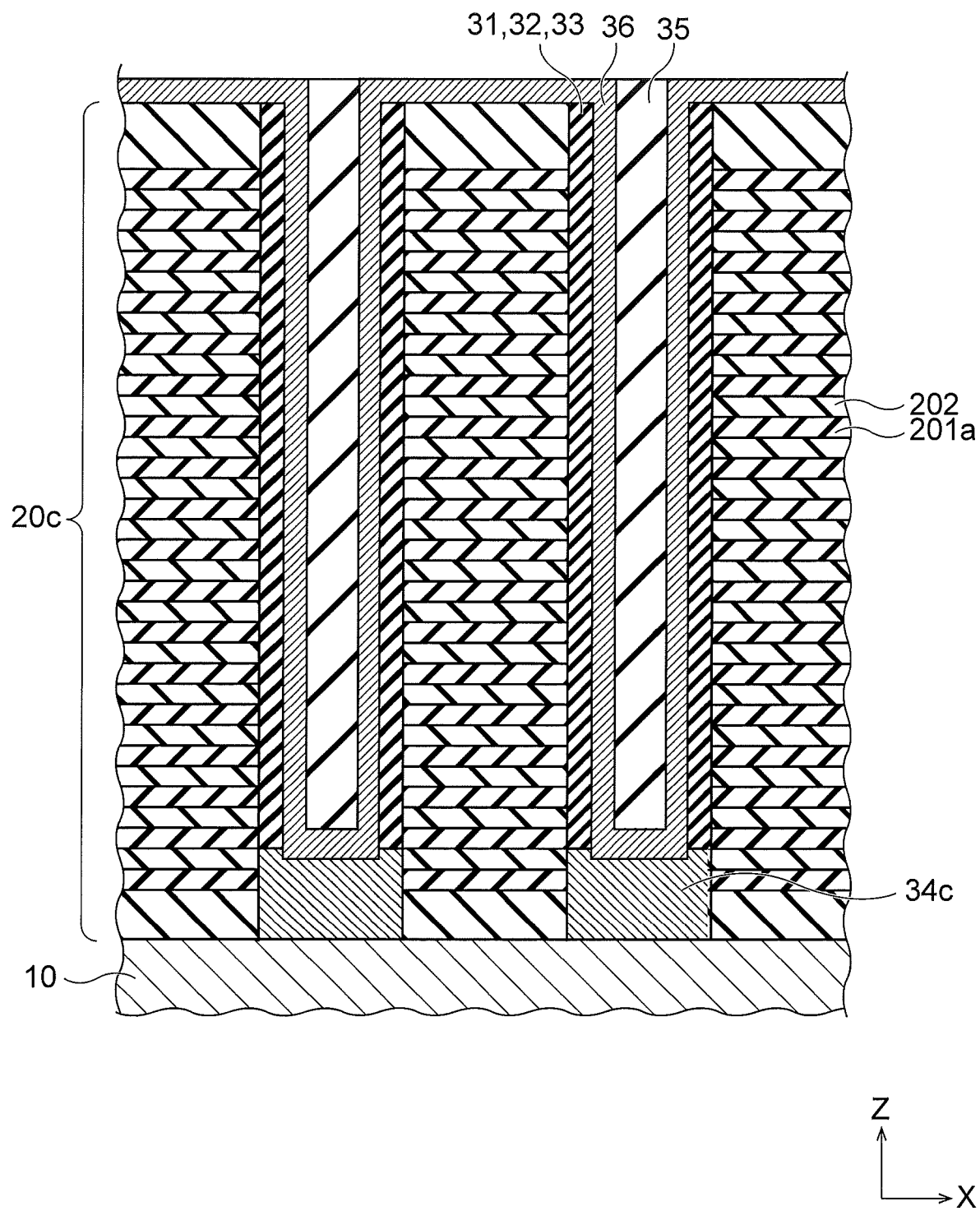
FIG. 15 is a sectional view illustrating a process of forming a channel film and a core dielectric film according to the third embodiment.

Next, the bottom surface of the memory film is removed and the channel film 36 (first channel film) is formed on the tunnel dielectric film 33 and the monocrystalline semiconductor parts 34c as illustrated in FIG. 15. Subsequently, the core dielectric film 35 is embedded in the holes 300.

Figure 16:
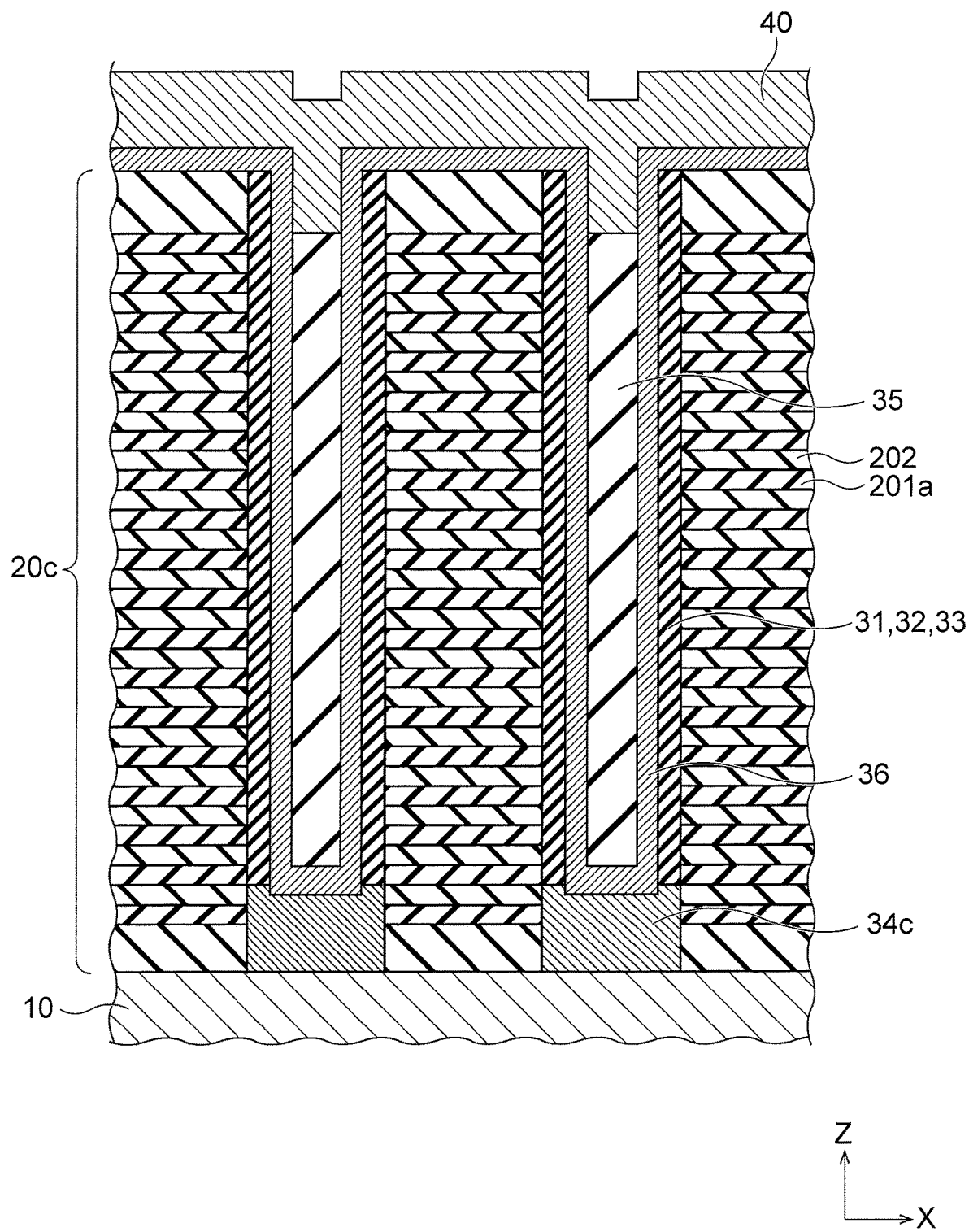
FIG. 16 is a sectional view illustrating a process of forming a core semiconductor film according to the third embodiment.

Next, upper portions of the core dielectric film 35 are etched back and the core semiconductor film 40 is formed in concave portions formed by the etching back and on the upper surface of the stacked body 20c as illustrated in FIG. 16. The core semiconductor film 40 can be formed, for example, of amorphous silicon. Thereafter, upper portions of the channel film 36 and the core semiconductor film 40 are doped with phosphorus or arsenic and the upper portions of the channel film 36 and the core semiconductor film 40 become an n-type semiconductor.

Figure 17:
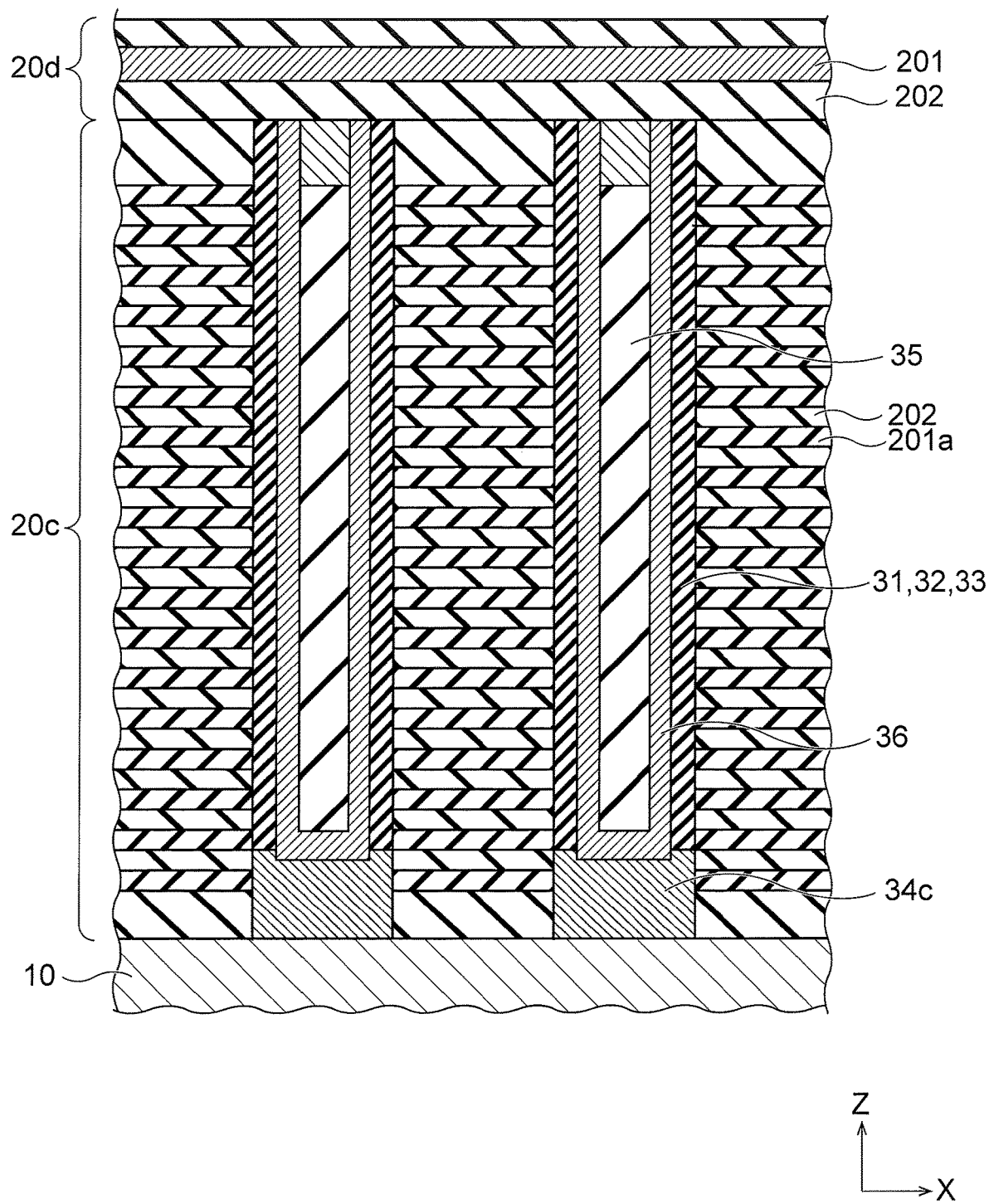
FIG. 17 is a sectional view illustrating a process of forming a stacked body according to the third embodiment.

Next, a stacked body 20d (second stacked body) is formed on the upper surface of the stacked body 20c as illustrated in FIG. 17. The stacked body 20d is formed by alternately stacking the conductive films 201 and the insulating films 202 in the Z-direction. These conductive films 201 correspond to selection gate electrodes of the SGD 21.

Figure 18:
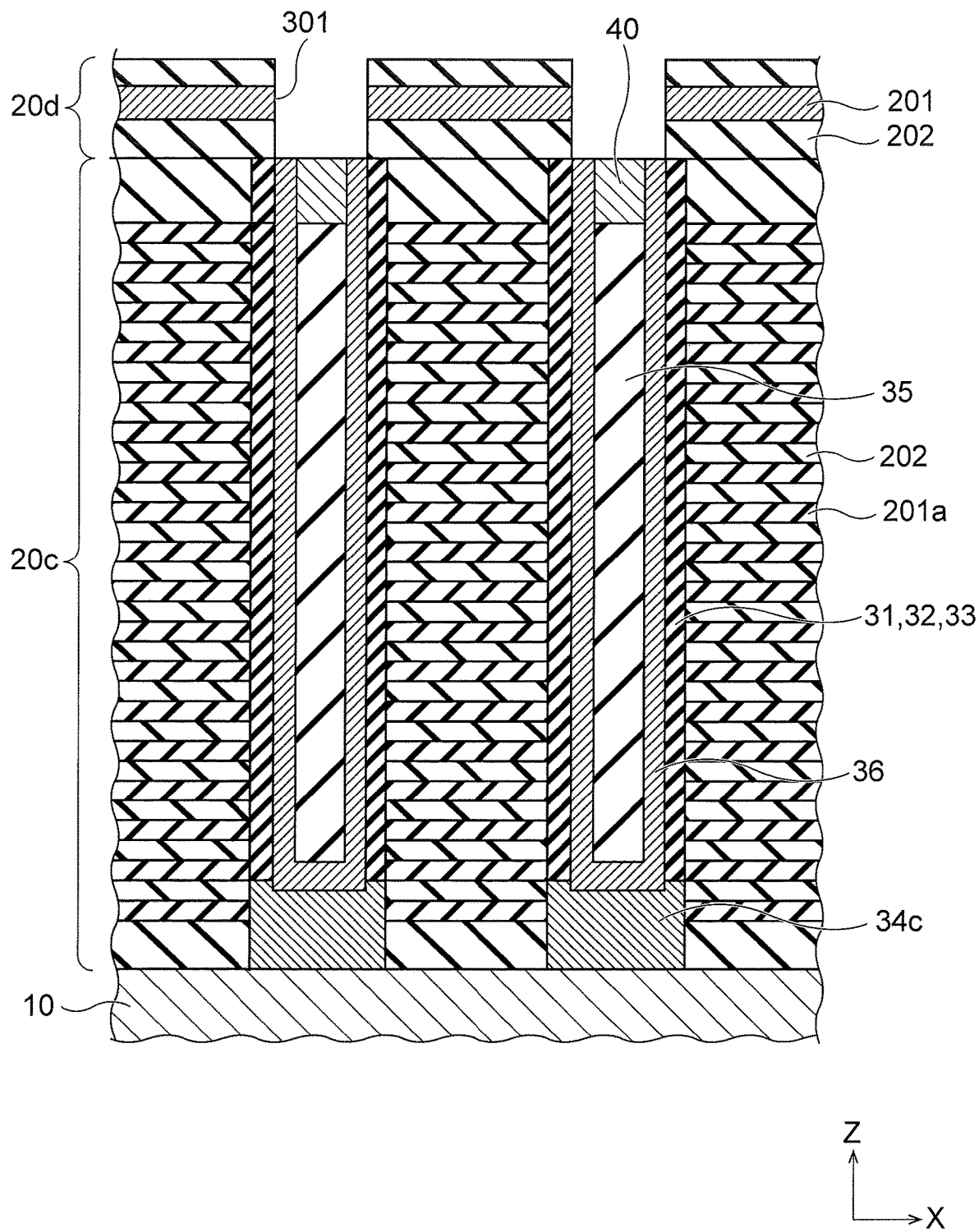
FIG. 18 is a sectional view illustrating a process of forming holes according to the third embodiment.

Next, holes 301 (second holes) penetrating the stacked body 20d are formed as illustrated in FIG. 18. The holes 301 are formed on the channel film 36 and the core semiconductor film 40.

Figure 19:
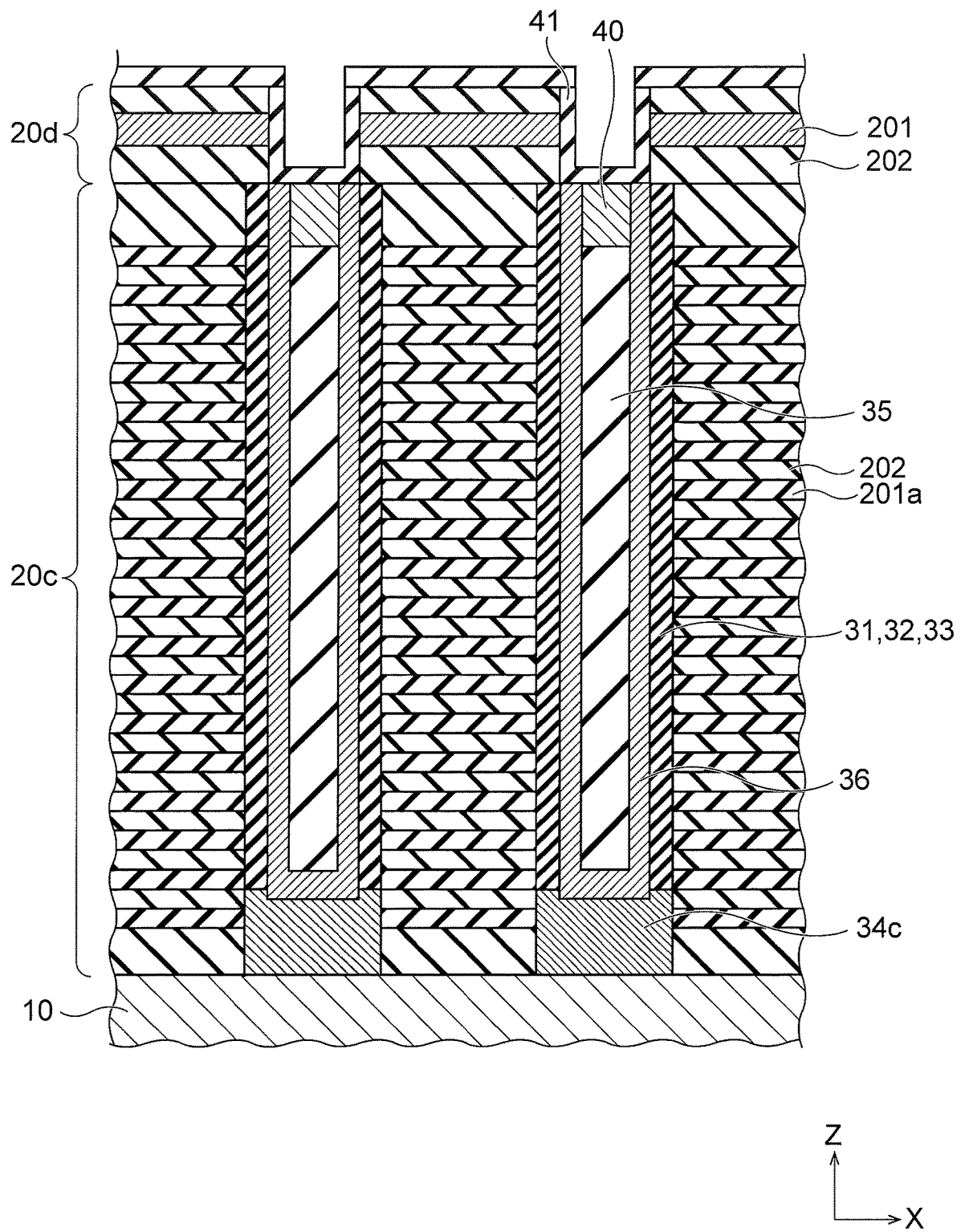
FIG. 19 is a sectional view illustrating a process of forming a gate dielectric film according to the third embodiment.

Subsequently, a gate dielectric film 41 is formed in the holes 301 as illustrated in FIG. 19. The gate dielectric film 41 is, for example, a silicon dioxide film.

Figure 20:
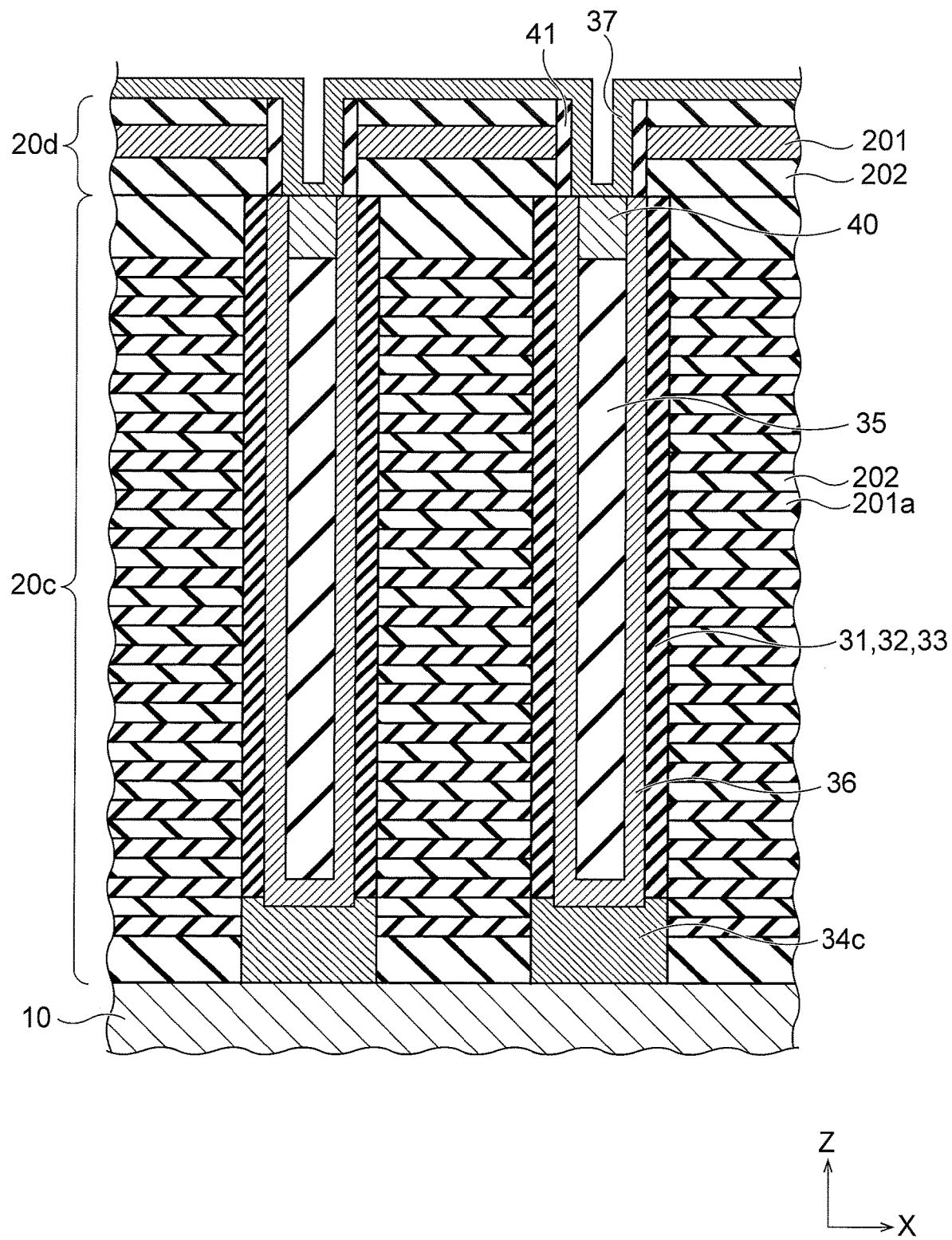
FIG. 20 is a sectional view illustrating a process of forming a channel film according to the third embodiment.

Next, the bottom surface of the gate dielectric film 41 is removed and a channel film 37 (second channel film) is formed as illustrated in FIG. 20. The channel film 37 is formed by an identical method to that of the channel film 36.

Figure 21:
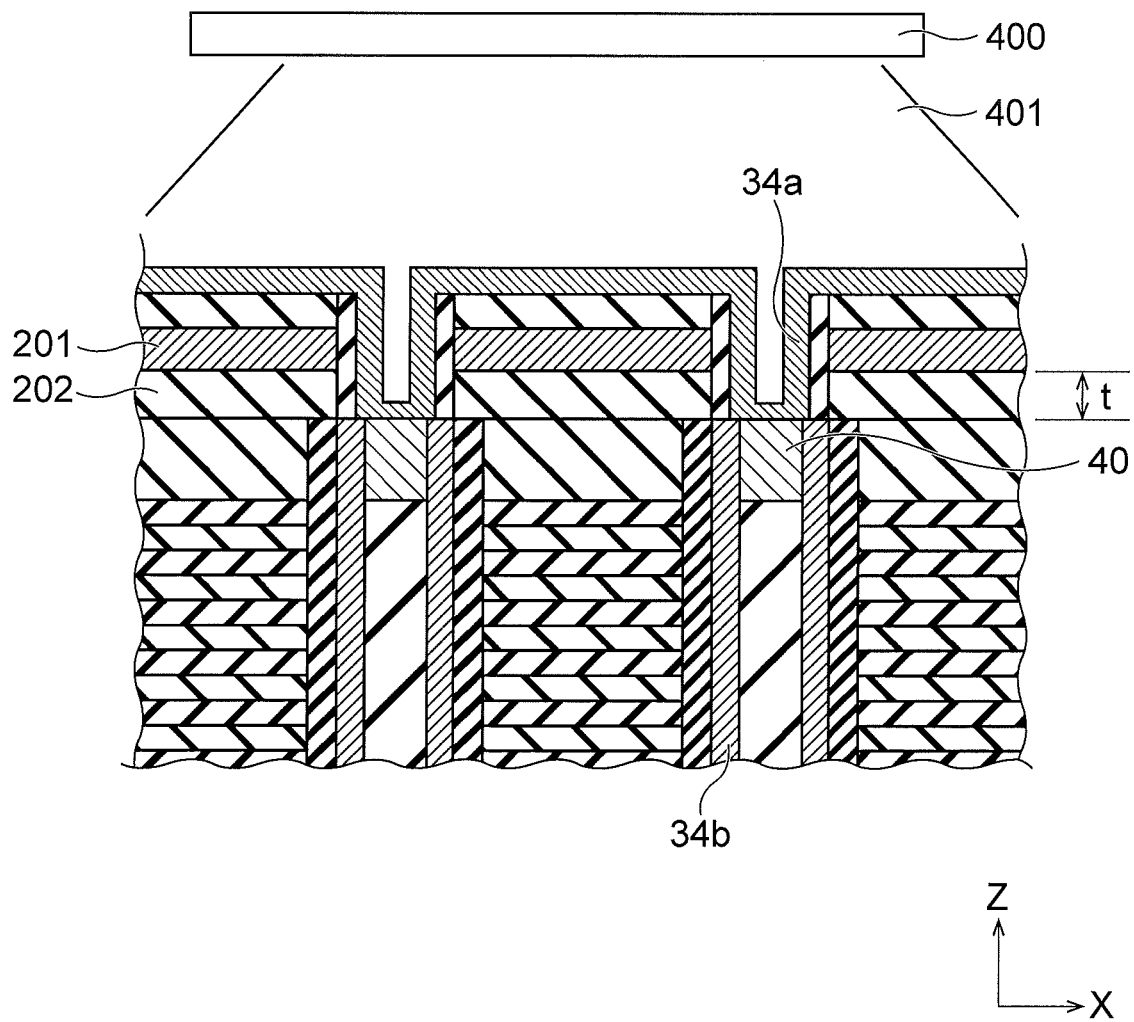
FIG. 21 is a sectional view illustrating a process of flashlamp annealing according to the third embodiment.

Next, flashlamp annealing is performed as illustrated in FIG. 21. In this flashlamp annealing, the light source 400 emits the flashlamp light 401 from above the stacked body 20d. In the present embodiment, the light source 400 is a xenon flashlamp.

Due to the flashlamp light 401, the channel film 37 of the stacked body 20d produces heat and melts. As a result, the channel film 37 becomes low-resistance monocrystalline semiconductor parts 34a. Meanwhile, the channel film 36 of the stacked body 20c is not melted because of the conductive film 201 of the stacked body 20d functioning as a light shielding film. Accordingly, the channel film 36 becomes the polycrystalline semiconductor parts 34b. The core semiconductor layer 40 becomes a monocrystalline layer or a polysilicon layer by the flashlamp annealing or subsequent annealing processing performed in manufacturing of the semiconductor device.

When the thickness of the insulating film 202 located in the bottommost layer of the stacked body 20d is equal to or smaller than 20 nanometers, heat produced by melting of the channel film 37 is likely to transmit to a contact portion between the channel film 36 and the channel film 37 and a contact portion between the channel film 37 and the core semiconductor film 40. Accordingly, the contact resistance can be reduced.

Figure 22:
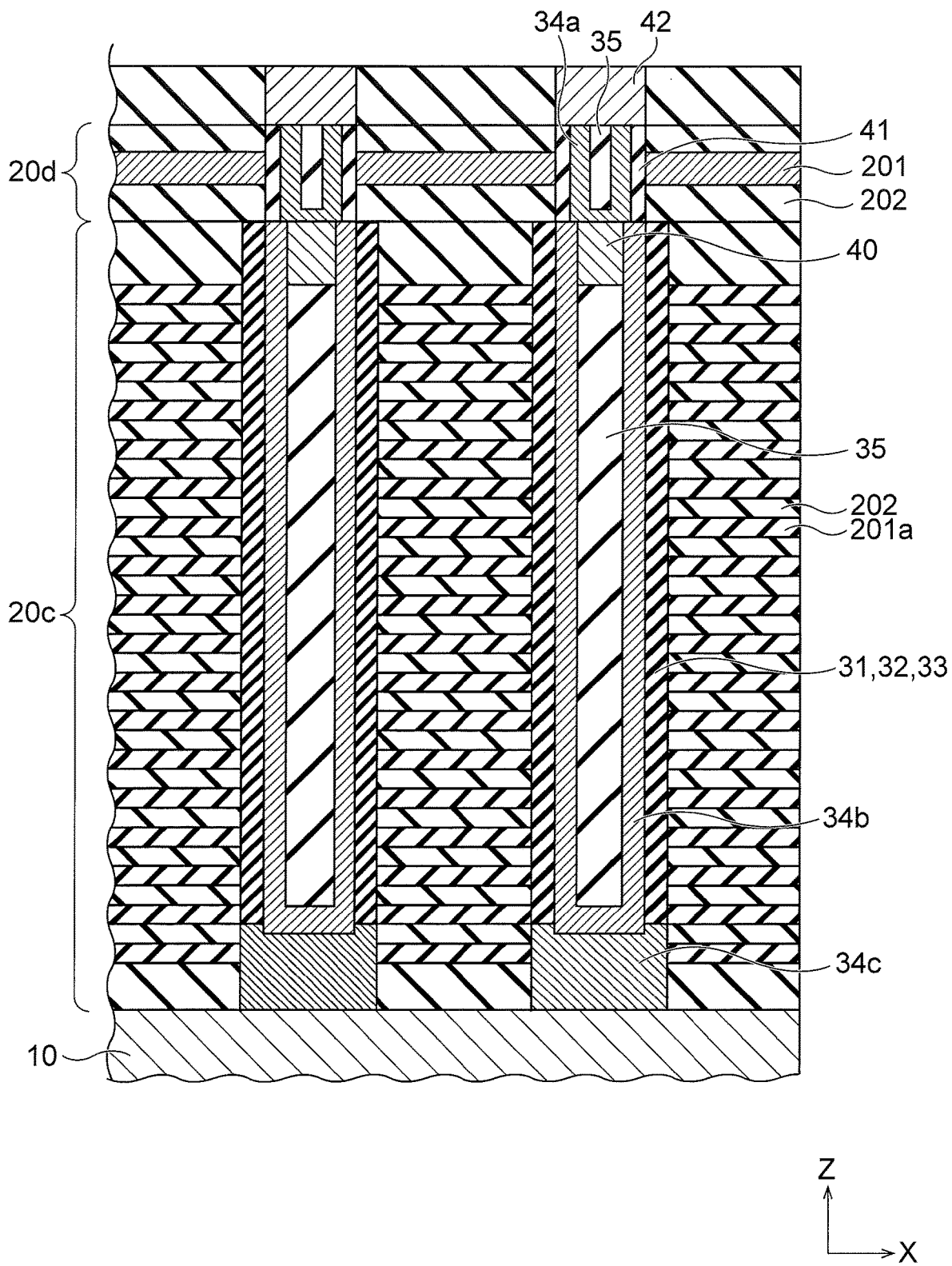
FIG. 22 is a sectional view illustrating a process of contacts according to the third embodiment.

Next, as illustrated in FIG. 22, the core dielectric film 35 is embedded and contacts 42 electrically connected to the monocrystalline semiconductor parts 34a are formed. Thereafter, the insulating films 201a are replaced with the conductive films 201 similarly in the first embodiment. As a result, the semiconductor device 3 illustrated in FIG. 12 is completed. The flashlamp annealing described above may be performed after formation of the contacts 42.

According to the present embodiment explained above, a portion to be monocrystallized in the channel film can be controlled by forming the SGD 21 in a different process from that of the cell 22. This enables, for example, only a channel film of drain-side selection transistors provided in the SGD 21 to be monocrystallized. Therefore, the resistance of the channel film of the drain-side selection transistors and the contacts 42 connected to the channel film can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a stacked body comprising first films and second films that are alternately stacked;
   a light shielding film provided in a specific layer of the stacked body and having a higher optical absorptivity than that of the second films; and
   a channel film extending in the stacked body in a stacking direction, wherein
   the channel film comprises a first part located on an upper side than the light shielding film in the stacking direction and containing a monocrystalline semiconductor,
   the first films are conductive films,
   a material of the first films differs from a material of the light shielding film,
   a first plurality of the first films is provided above the light shielding film in the stack,
   a second plurality of the first films is provided below the light shielding film in the stack,
   the channel film comprises a second part located on a lower side of the light shielding film in the stacking direction and comprises polycrystalline semiconductor, and
   the light shielding film is disposed at a position in the stack corresponding to a junction between the first and second parts.

2. The device of claim 1, wherein
   the second films are insulating films, and
   the insulating films are stacked between the light shielding film and the conductive films.

3. The device of claim 1, further comprising a memory film provided between the first films and the channel film, wherein
   the first films comprise word lines facing the second part with the memory film interposed therebetween, and selection gate electrodes facing the first part with the memory film interposed therebetween.

4. The device of claim 3, further comprising a core semiconductor film provided between the word lines and the selection gate electrodes.

5. The device of claim 1, wherein a material of the light shielding film contains silicon.

6. The device of claim 1, wherein
   the material of the first films is tungsten, and the material of the light shielding film is silicon or molybdenum.

7. The device of claim 1, wherein
   a thickness of the light shielding film is smaller than that of the first film.

8. The device of claim 1, wherein
   the first films are word lines.

9. The device of claim 1, wherein
   the first films and the second films are in direct contact with each other,
   the light shielding film consists of a single layer of one conductive material, and
   first and second insulating films are disposed in direct contact with opposing faces of the light shielding film in the stack.

* * * * *